(12) United States Patent
Kamgaing et al.

(10) Patent No.: US 12,040,776 B2
(45) Date of Patent: Jul. 16, 2024

(54) INTEGRATED RADIO FREQUENCY (RF) FRONT-END MODULE (FEM)

(71) Applicant: Intel Corporation, Santa Clara, CA (US)

(72) Inventors: Telesphor Kamgaing, Chandler, AZ (US); Aleksandar Aleksov, Chandler, AZ (US); Feras Eid, Chandler, AZ (US); Georgios Dogiamis, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1124 days.

(21) Appl. No.: 16/526,633

(22) Filed: Jul. 30, 2019

(65) Prior Publication Data

US 2021/0036682 A1    Feb. 4, 2021

(51) Int. Cl.
| | |
|---|---|
| *H03H 9/05* | (2006.01) |
| *H01L 23/00* | (2006.01) |
| *H01L 23/538* | (2006.01) |
| *H01L 25/00* | (2006.01) |
| *H01L 25/18* | (2023.01) |
| *H03H 9/58* | (2006.01) |
| *H10N 30/87* | (2023.01) |
| *H10N 30/88* | (2023.01) |
| *H10N 39/00* | (2023.01) |
| *H01L 23/498* | (2006.01) |

(52) U.S. Cl.
CPC ....... *H03H 9/0552* (2013.01); *H01L 23/5385* (2013.01); *H01L 24/16* (2013.01); *H01L 25/18* (2013.01); *H01L 25/50* (2013.01); *H03H 9/58* (2013.01); *H10N 30/875* (2023.02); *H10N 30/883* (2023.02); *H10N 39/00* (2023.02); *H01L 23/49816* (2013.01); *H01L 2224/16225* (2013.01); *H01L 2924/19042* (2013.01)

(58) Field of Classification Search
CPC ..... H01L 23/5385; H01L 25/18; H01L 25/50; H01L 27/20; H01L 2924/19042
See application file for complete search history.

(56) References Cited

U.S. PATENT DOCUMENTS

| | | |
|---|---|---|
| 7,615,833 B2 | 11/2009 | Larson, III et al. |
| 7,635,606 B2 | 12/2009 | Warren et al. |
| 8,824,163 B2 | 9/2014 | Kim et al. |
| 2006/0012021 A1 | 1/2006 | Larson, III et al. |
| 2007/0012655 A1 | 1/2007 | Kwon et al. |
| 2008/0217708 A1 | 9/2008 | Reisner et al. |
| 2009/0212374 A1 | 8/2009 | Huang et al. |
| 2010/0091473 A1* | 4/2010 | Kiwitt ................... H03H 9/725 361/782 |
| 2012/0049978 A1 | 3/2012 | Pang et al. |
| 2015/0256127 A1* | 9/2015 | Takebayashi ........ H03H 9/1071 331/68 |

(Continued)

*Primary Examiner* — Thanh Y. Tran
(74) *Attorney, Agent, or Firm* — Akona IP PC

(57) ABSTRACT

Embodiments may relate to a radio frequency (RF) front-end module (FEM) that includes an acoustic wave resonator (AWR) die. The RF FEM may further include an active die coupled with the package substrate of the RF FEM. When the active die is coupled with the package substrate, the AWR die may be between the active die and the package substrate. Other embodiments may be described or claimed.

22 Claims, 10 Drawing Sheets

(56) References Cited

U.S. PATENT DOCUMENTS

| | | |
|---|---|---|
| 2017/0063412 A1 | 3/2017 | Ripley et al. |
| 2020/0235716 A1* | 7/2020 | Eid .......................... H01L 23/66 |
| 2020/0287520 A1 | 9/2020 | Kamgaing et al. |
| 2020/0395915 A1* | 12/2020 | Giner De Haro .. H03H 9/02275 |
| 2021/0036685 A1* | 2/2021 | Kamgaing ............... H03H 9/64 |

* cited by examiner

Positioning an acoustic wave resonator (AWR) die adjacent to a package substrate
605

Coupling an active die with the package substrate such that the AWR die is between the active die and the package substrate
610

INTEGRATED RADIO FREQUENCY (RF) FRONT-END MODULE (FEM)

BACKGROUND

Network access points and user terminals (e.g., smartphones or tablets) for next generation mobile and wireless communication may include several radio frequency (RF) front-end modules (FEMs) which may be dedicated to either receive or transmit electrical signals. In legacy RF FEMs, components may be assembled in a two-dimensional (2D) arrangement on a printed circuit board (PCB) or package substrate. In other words, pre-packaged integrated circuits (ICs), non-package ICs, or filtering dies may be assembled next to each other on the package substrate or PCB. This arrangement may lead to large form factor modules that occupy real estate that could be used for other components such as a larger battery.

DETAILED DESCRIPTION

Figure 1:
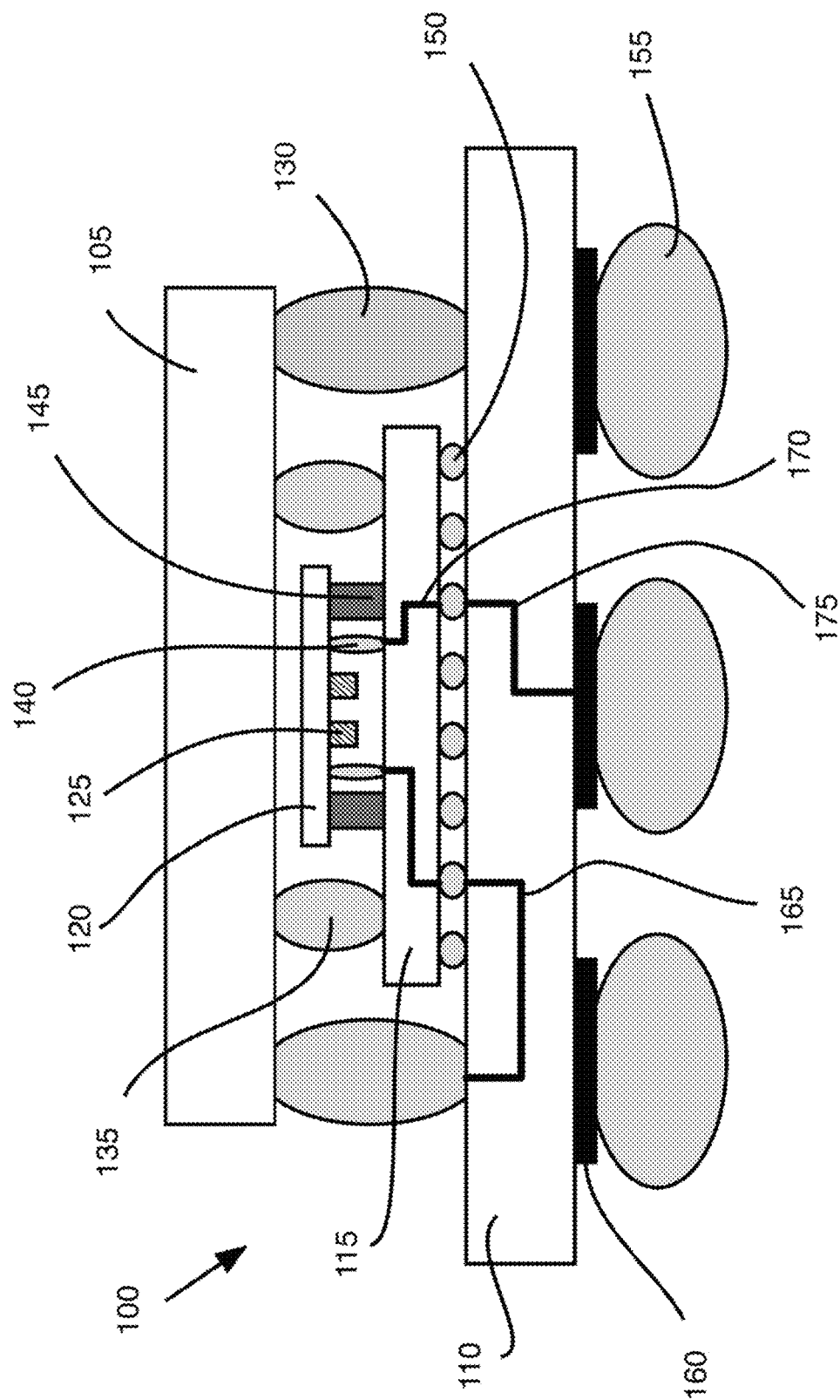
FIG. 1 depicts a side view of an example integrated RF FEM, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As described above, legacy RF FEMs may include components that are laid out in a 2D pattern, i.e., next to one another. This pattern may lead to relatively large form factor devices or modules. By contrast, embodiments herein relate to the compact realization of RF FEMs through 3D integration of components and double-sided assembly on a PCB or package substrate. More specifically, embodiments herein relate to combining acoustic wave resonator (AWR) dies with active dies and on-package passives in a vertical stackup. This vertical stackup may reduce the form factor of the resultant RF FEM. Additionally, embodiments herein may relate to double-sided assembly when traditional or non-highly-integrated filters are used.

Embodiments may provide a number of advantages over legacy RF FEMs. For example, in some embodiments the AWR dies may be lithographically defined. That is, the AWR dies may be generated using a lithographic technique. The lithographic pattern used on the die may influence o define the resonant frequency or frequencies of the AWR. This may be in contrast to, for example, other AWRs wherein the die thickness may influence or define the resonant frequency/ frequencies of the AWR. The lithographically defined resonators may enable the integration of multiple filter components operating at different frequencies on the same die, and therefore reduce the number of dies in a RF FEM. Additionally, a vertically-integrated RF FEM may shrink the overall footprint of the module in an electronic device, resulting in more room for additional components in a device such as a battery or some other components. Additionally, the double-sided assembly approach may free up inner layers of the substrate and therefore enable integration of components such as inductors in the active die shadow. Other advantages may be present in other embodiments.

FIG. 1 depicts a side view of an example integrated RF FEM 100, in accordance with various embodiments. It will be understood that in the depictions and discussions of FIGS. 1-5, each and every element of a Figure may not be enumerated for the sake of elimination of redundancy and clutter. For example, if a given Figure includes multiple of a specific element such as an active die, a resonator, a specific interconnect, etc., then only one instance of that element may be enumerated in the Figure. However, it will be understood that identical elements within a given Figure may share characteristics of the enumerated element. Additionally, FIGS. 2-5 depict alternative examples of integrated RF FEMs, in accordance with various embodiments. Generally, each and every element of the FIGS. 2-5 may not be enumerated for the sake of lack of redundancy. However, it will be understood that elements that are similar between FIG. 1 and another Figure (e.g., various interconnects, etc.) may be considered to be generally similar and share one or more characteristics without the need for further elaboration within the description of the subsequent Figure.

The RF FEM 100 may include an active die 105, an AWR die 120, and a package substrate 110. The active die 105, the AWR die 120, and the package substrate 110 may be arranged in a vertical stack. In embodiments, the z-height of the overall vertical stack (e.g., the height of the RF FEM 100 as measured vertically with respect to the orientation of FIG. 1) may be less than approximately 900 micrometers ("microns"). In some embodiments, the z-height of the RF FEM 100 may be less than approximately 800 microns. In some embodiments, the z-height of the RF FEM 100 may be measured exclusive of the interconnects 155, while in other embodiments the z-height of the RF FEM 100 may be measured inclusive of the interconnects 155.

The active die 105 may be a die that includes active circuits related to a transmit module. The active circuits may include circuits such as control logic, one or more switches, one or more power-management integrated circuits (PMICs), one or more radio frequency integrated circuits (RFICs) one or more power amplifiers (PAs), or some other component of a transmit module. Additionally or alternatively, the active die 105 may include active circuits related to a receive module. The active circuits may include control logic, one or more switches, one or more PMICs, one or more RFICs, one or more low-noise amplifiers (LNAs), or some other component of a receive module. In some embodiments, the die may further include mixers, phase shifters, or some other circuit which may facilitate the reception of, or processing of, an electronic signal such as a wireless signal. In some embodiments, the active die 105 may include one or more passive elements such as capacitors, resistors, inductors, diodes, etc.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a PCB, an interposer, a motherboard, or some other type of substrate.

The AWR die 120 may include or be coupled with one or more resonators 125. In some embodiments, the resonators 125 may be lithographically defined. That is, the resonators 125 may be formed through lithographic etching of the substrate of the AWR die 120 during the manufacture of the AWR die 120. In other embodiments the resonators 125 may be coupled with the substrate of the AWR die 120 subsequent to the manufacture of the substrate of the AWR die 120. One of the resonators 125 may be, for example, a contour mode resonator (CMR), a surface acoustic wave (SAW) resonator, a thin-film bulk acoustic resonator (FBAR), a bulk acoustic wave resonator (BAR), or some other type of resonator. In some embodiments, an AWR die 120 may include a plurality of resonators 125 as depicted in FIG. 1. One of the resonators 125 may be of a different type than another of the resonators 125.

In some embodiments, one of the resonators 125 may resonate at a frequency that is different than a resonating frequency of another of the resonators 125. For example, one of the resonators 125 may resonate at a frequency that is generally associated with a fourth generation (4G) wireless transmission while another of the resonators 125 may resonate at a frequency that is generally associated with a fifth generation (5G) wireless transmission. Alternatively, the two resonators 125 may resonate at different frequencies within a 4G or 5G bandwidth. It will be understood that these descriptions of resonant frequencies are intended as examples, and other embodiments may have more or fewer resonators 125 which may resonate at either the same, or different, frequencies than one another or than are described herein. More generally, one resonator 125 may cover a first frequency or a first frequency bandwidth, and another resonator 125 may cover a second frequency or a second frequency bandwidth that is overlapping, non-overlapping, or partially overlapping of the first frequency or first frequency bandwidth.

In some embodiments, the package substrate 110 may include one or more passive components which may be communicatively coupled with the AWR die 120 or, more specifically, resonators 125 of the AWR die 120. The passive components may include, for example, various capacitors, resistors, inductors, etc. The passive components may be used for the termination of filter circuits associated with various of the resonators 125 or the AWR dies 120, or as part of matching networks between the various components of the RF FEM 100. Generally, the additional passive components are not depicted in FIG. 1 for the sake of reduction of clutter of the Figure.

The AWR die 120 may be coupled with a lid 115. The lid 115 may, in some embodiments, be referred to as an interposer. Generally, the lid 115 may be formed of a non-organic or non-polymer material which may physically or electromagnetically shield the resonators 125 of the AWR die 120. Example materials of the lid 115 may include silicon, silicon nitride, ceramic, metal, organic substrate with silicon nitride or metal surface finish, or some other appropriate material.

The AWR die 120 may be coupled with the lid 115 by one or more interconnects 140. The interconnects 140 may be, for example, solder bumps that are formed of a material such as tin, silver, copper, etc. If solder bumps are used for the interconnects 140, then the solder bumps may be elements of a ball grid array (BGA). In other embodiments, the interconnects 140 may be pins of a pin grid array (PGA), elements of a land grid array (LGA), or some other type of interconnect. In some embodiments, the interconnects 140 may be formed of a copper pillar that may couple with the AWR die 120. Solder may be applied to the pillar at the side of the lid 115, or metal-to-metal bonding may be used. Generally, the interconnects 140 may have a z-height (that is, a vertical height as measured with respect to the orientation of FIG. 1) of between approximately 2 and approximately 20 microns.

Generally, the interconnects 140 may physically or communicatively couple the die AWR die 120 with the lid 115. For example, one or more of the interconnects 140 may physically couple with, and allow electrical signals to pass between, pads of the AWR die 120 and pads of the lid 115 (not shown for the sake of elimination of clutter of FIG. 1). In other embodiments, the interconnects 140 may physically couple the AWR die 120 and the lid 115, but the interconnects 140 may not communicatively couple the AWR die 120 and the lid 115. In some embodiments, the interconnects 140 may be replaced by, or may be supported by, a socket, a clamp, a latch, or some other type of mechanical mechanism.

It may be desirable for the resonators 125 to be protected from ambient conditions such as heat or humidity. Therefore, a connective element such as a seal 145 may be present near a periphery of the AWR die 120 and the lid 115. The seal 145 may be, for example, metal, silicon, silicon nitride, or some other material which may hermetically seal the cavity between the AWR die 120 and the lid 115 in which the resonators 125 are located. As used herein, a "hermetic seal" may be a seal which makes the cavity airtight so that ambient conditions external to the sealed cavity may not affect the resonators 125. In some embodiments, the seal 145 (separately from or in conjunction with lid 115) may also provide additional physical, atmospheric, or electromagnetic protection for the AWR die 120 or, more specifically, the resonators 125 of the AWR die 120.

It will be understood that although the RF FEM 100 depicts the AWR die 120 as coupled with a lid 115 which may, in conjunction with the seal 145, may physically or electromagnetically protect the AWR die 120 or the resonators 125 of the AWR die 120, other embodiments may not include the lid 115. For example, in some embodiments the AWR die 120 may be coupled directly with the package substrate 110, for example by interconnects such as interconnects 140 and a seal such as seal 145. In this embodiment, it may be desirable for the package substrate 110 to be formed of the non-polymer or non-organic material described above with respect to lid 115. Other variations may be present in other embodiments.

The lid 115 may be connected with the package substrate 110 by one or more interconnects 150, which may be similar to, and share one or more characteristics with, interconnects 140. Similarly, the active die 105 may be coupled with the package substrate 110 by one or more interconnects 130, which may be similar to, and share one or more characteristics with, interconnects 140. Similarly, the active die 105 may be coupled with the lid 115 by one or more interconnects 135 which may be similar to, and share one or more characteristics with, interconnects 140. It will be understood that in some embodiments each of interconnects 130, 135, 140, and 150 may be the same type of interconnect as one another, for example all elements of a BGA, or all elements of a PGA, etc. In other embodiments, one or more of the interconnects 130/135/140/150 may be of a different type than another of the interconnects 130/135/140/150. For example, interconnects 130 may be elements of a BGA and interconnects 135 may be elements of a PGA. Some of the interconnects 130/135/140/150 may use metal pillars, solder balls with a metal core, solders with melting temperatures different than those of others of the interconnects, etc. Other variations may be present in other embodiments.

In some embodiments, the RF FEM 100 may include one or more additional interconnects 155 which may be used to couple the RF FEM 100 to, for example, another element of a computing device such as a PCB, a motherboard, an interposer, etc. Specifically, the interconnects 155 may be respectively physically and communicatively coupled with a pad 160 of the package substrate 110. The interconnects 155 may be similar to, and share one or more characteristics of, interconnects 140 described above. The pad 160 may be formed of a conductive material such as copper, gold, etc. It will be understood that in various embodiments others of the interconnects 130/135/140/150 may be coupled with pads that are similar to pads 160, but which are not shown in FIG. 1 for the sake of reduction of clutter of the Figure.

In some embodiments the RF FEM 100 may include one or more conductive paths such as conductive paths 165, 170, or 175. A conductive path 165/170/175 may include one or more conductive elements such as a via, a pad, a stripline, a microstrip, a trace, etc. More generally, a conductive path 165/170/175 may allow electrical signals to transfer between two elements of the RF FEM 100, or between an element of the RF FEM 100 and another element of an electronic device to which the RF FEM 100 is coupled.

For example, the lid 115 may include one or more conductive pathways 170. An electronic signal may go from the AWR die 120 to the package substrate 110 by following a route such as interconnect 140 to conductive pathway 170, and then through interconnect 150. Similarly, the electronic signal may follow the reverse route from the package substrate 110 to the AWR die 120.

Similarly, the package substrate 110 may include one or more conductive pathways such as conductive pathways 165 and 175. In some embodiments, conductive pathway 175 may communicatively couple interconnect 150 to interconnect 155. In this manner, conductive pathways 170 and 175 may communicatively couple the AWR die 120 to an interconnect 155 and, through interconnect 155, to an element of an electronic device to which the RF FEM 100 is coupled. Similarly, conductive pathway 165 may link interconnect 150 to interconnect 130. In this manner, conductive pathways 170 and 165 may communicatively couple the AWR die 120 to the active die 105 by way of interconnects 140, 150, and 130.

It will be understood that the above descriptions and depicted configuration of FIG. 1 is intended as one example. Other embodiments may have other configurations. For example, some embodiments may include more or fewer interconnects, pads, resonators, AWR dies, conductive pathways, active dies, etc. than are depicted in FIG. 1. In some embodiments certain elements may be larger or smaller than depicted with respect to another in one or more directions. For example, in some embodiments various of the interconnects may be larger or smaller, thinner or wider, etc. than depicted. Generally, unless otherwise specifically stated, the relative sizes of elements may be different than depicted. Other variations may be present in other embodiments.

Figure 2:
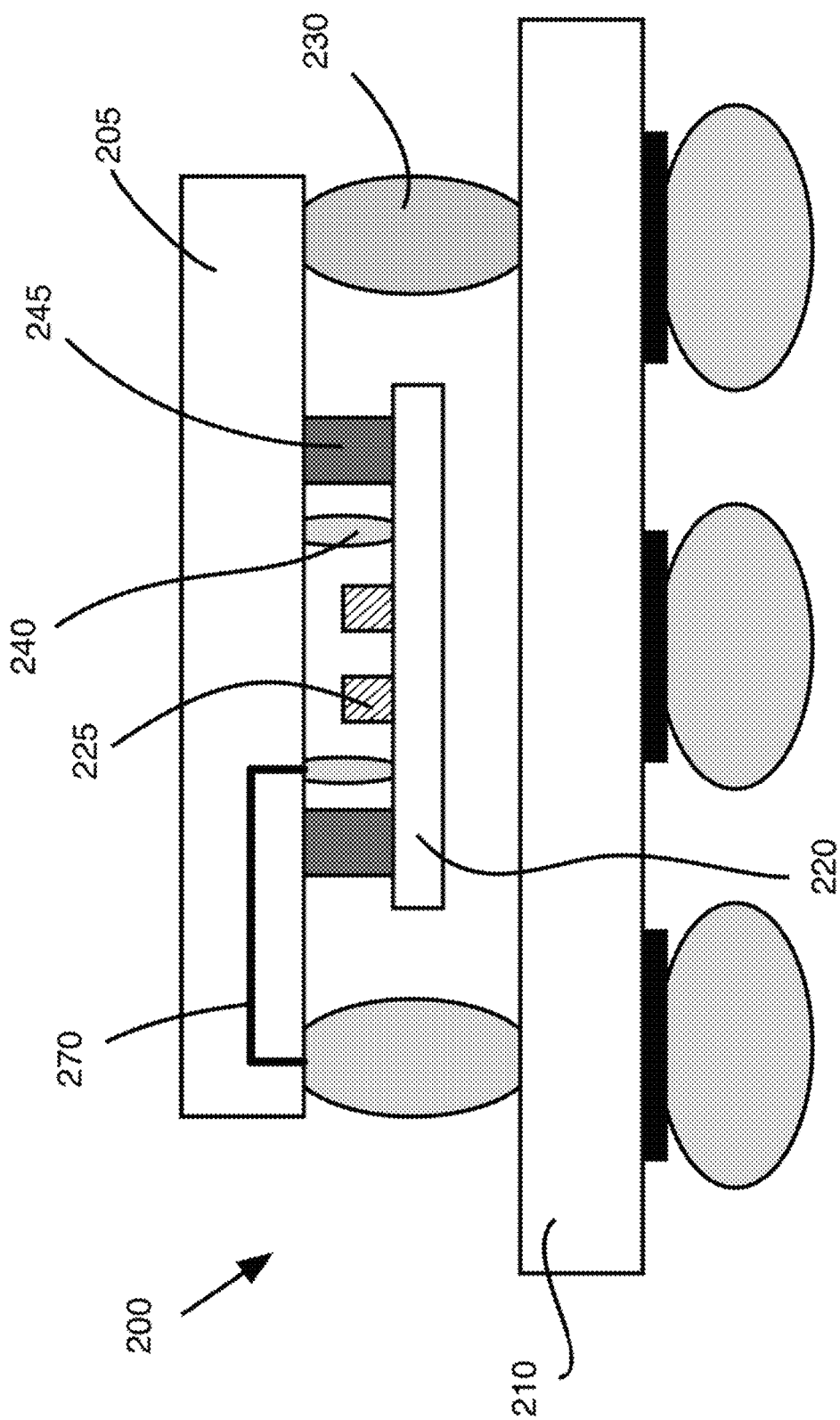
FIG. 2 depicts a side view of an alternative example of an integrated RF FEM, in accordance with various embodiments.

FIG. 2 depicts a side view of an alternative example of an integrated RF FEM 200, in accordance with various embodiments. Generally, the RF FEM 200 may include an active die 205, a package substrate 210, and an AWR die 220 which may be respectively similar to, and share one or more characteristics of, active die 105, package substrate 110, and AWR die 120. The AWR die 220 may include or be coupled with one or more resonators 225, one or more interconnects 240, and a seal 245 which may be respectively similar to, and share one or more characteristics with, resonators 125, interconnects 140, and seal 145. The active die 205 may be coupled with the package substrate 210 by one or more interconnects 230 which may be similar to, and share one or more characteristics with, interconnects 130.

As can be seen, in the embodiment of RF FEM 200 of FIG. 2, the AWR die 220 may be coupled with the active die 205 instead of the package substrate 210. In this embodiment, the AWR die 220 may be directly coupled with the active die 205 instead of including, for example, an intermediate element such as lid 115. In this embodiment it may be desirable for the active die 205 to be at least partially formed of a hermetic material such as the non-polymer or non-organic materials described above with respect to lid 115.

In this embodiment, the active die 205 may include one or more conductive pathways 270 which may be similar to, and share one or more characteristics with, conductive pathways 165, 170, or 175. Specifically, the conductive pathway(s) 270 may include various conductive elements such as pads, vias, traces, microstrips, striplines, etc. Although not specifically depicted, other elements of the RF FEM 200 such as the package substrate 210 may additionally include one or more conductive pathways. In the embodiment of FIG. 2, the conductive pathway 270 may, for example, communicatively couple the AWR die 220 with the package substrate 210 in conjunction with various interconnects such as interconnects 240 and 230. If additional conductive pathways are included, for example in the package substrate 210, then the conductive pathways within the package substrate 210 may then further communicatively couple the AWR die 220 with an element of an electronic device to which the RF FEM 200 is coupled via the depicted interconnects which may be similar to interconnects 155.

In some embodiments, electrical performance requirements or process yield limitations may not allow the integration of all of the desirable resonators on the same AWR die. In other words, a single AWR die such as AWR dies 120 or 220 of RF FEMs 100 or 200 may not include a sufficient number of resonators such as resonators 125 or 225. In this embodiment, a plurality of AWR dies may be desirable in an RF FEM. As one example, one AWR die (which may include one or more resonators) may cover a frequency bandwidth from approximately 700 Megahertz (MHz) to approximately 1.6 Gigahertz (GHz). A second AWR die may cover a frequency bandwidth from approximately 1.6 GHz to approximately 2.8 GHz. A third AWR die may cover a frequency bandwidth from approximately 2.8 GHz to approximately 3.8 GHz.

If multiple AWR dies are used, two or more of the AWR dies may be from the same wafer as one another, or from different wafers as one another. In some embodiments, dies from different wafers may be desirable because then the thickness of the various AWR layers on each die may be adjusted to reduce or mitigate the occurrence of spurious modes originating from the thickness of the piezoelectric material used in the AWR.

Figure 3:
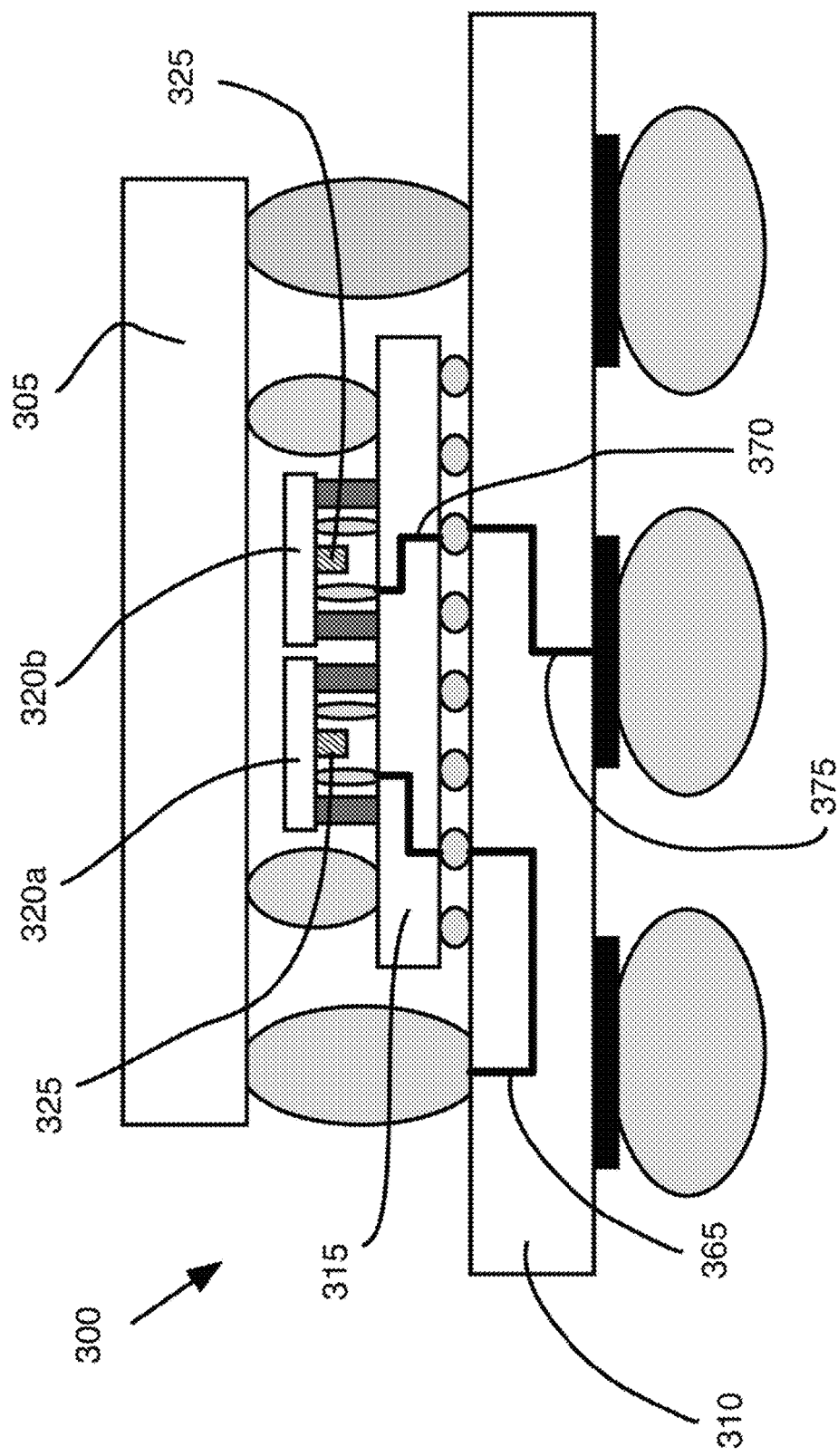
FIG. 3 depicts a side view of an alternative example of an integrated RF FEM, in accordance with various embodiments.

FIG. 3 depicts a side view of an alternative example of an integrated RF FEM 300, in accordance with various embodiments. Generally, the RF FEM 300 may include an active die 305, a package substrate 310, and a lid 315 which may be respectively similar to, and share one or more characteristics with, active die 105, package substrate 110, and lid 315. The RF FEM 300 may also include a plurality of AWR dies 320$a$ and 320$b$ which may be respectively similar to, and share one or more characteristics with, AWR die 120. Specifically, the AWR dies 320$a$ and 320$b$ may include one or more resonators 325 which may be similar to, and share one or more characteristics with, resonators 125. As described above, one of the AWR dies 320$a$ may be configured to cover a first frequency bandwidth, and the other of the AWR dies 320$b$ may be configured to cover a second frequency bandwidth which may be overlapping, non-overlapping, or partially overlapping of the first frequency bandwidth. In embodiments where the AWR dies (e.g. AWR die 320$a$) includes a plurality of resonators 325, then one of the resonators 325 may cover a first sub-bandwidth of the first frequency bandwidth and another of the resonators 325 may cover a second sub-bandwidth of the first frequency bandwidth which may be overlapping, non-overlapping, or partially overlapping of the first sub-bandwidth.

Although the AWR dies 320$a$ and 320$b$ are depicted as only including a single resonators 325 each, it will be understood that in some embodiments one or both of AWR dies 320$a$ and 320$b$ may include a plurality of resonators such as are shown in FIG. 1 or 2. Specifically, the single resonators 325 of AWR dies 320$a$ and 320$b$ are depicted for the sake of conciseness of the Figure and the ability to clearly show the various elements of the RF FEM 300.

The RF FEM 300, or elements thereof such as the lid 315 or package substrate 310, may include a plurality of conductive paths 365/370/375 which may be similar to, and share one or more characteristics of, conductive paths 165/170/175. The conductive paths 365/370/375 may communicatively couple various of the AWR dies 320$a$ or 320$b$ with other elements of the RF FEM 300 as described above. For example, as described above, the AWR die 320$a$ may be communicatively coupled with the active die 305 through conductive paths 370 and 365, as well as various of the depicted interconnects, as described above with respect to RF FEM 100. Similarly, the AWR die 320$b$ may be communicatively coupled with an element of an electronic device to which the RF FEM 300 is coupled through conductive paths 370 and 375, as well as various of the depicted interconnects, pads, etc. as described above with respect to RF FEM 100.

Figure 4:
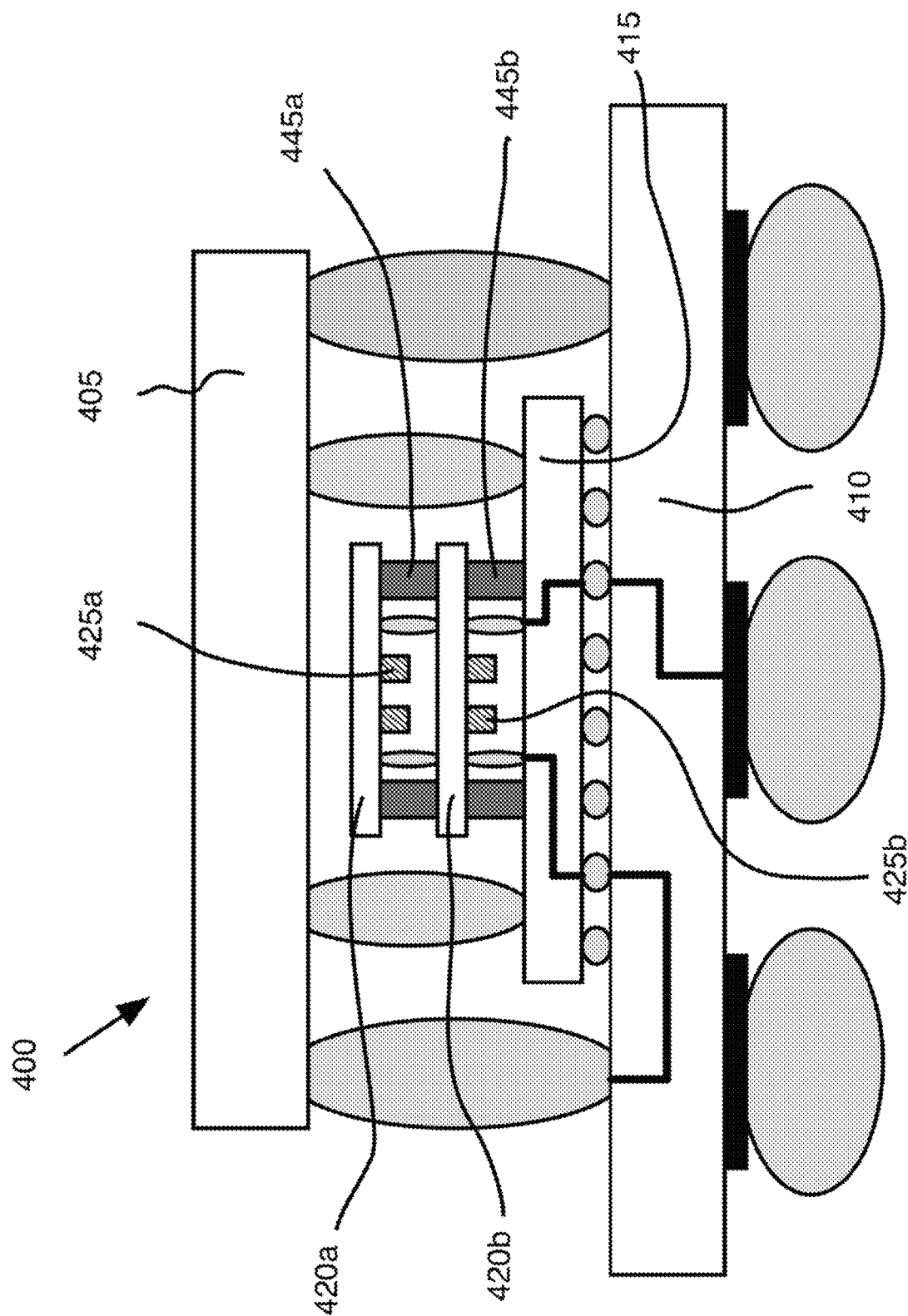
FIG. 4 depicts a side view of an alternative example of an integrated RF FEM, in accordance with various embodiments.

In some embodiments, that include a plurality of AWR dies, the AWR dies may not be positioned adjacent to one another as depicted in FIG. 3. Rather, in these embodiments the AWR dies themselves may be stacked vertically on one another. FIG. 4 depicts a side view of an alternative example of an integrated RF FEM 400 that includes a plurality of vertically stacked AWR dies 420*a* and 420*b*, in accordance with various embodiments.

The RF FEM 400 may include an active die 405, a package substrate 410, and a lid 415 which may be respectively similar to, and share one or more characteristics with, active die 105, package substrate 110, and lid 115. The RF FEM 400 may also include a plurality of AWR dies such as AWR dies 420*a* and 420*b*, which may be similar to, and share one or more characteristics with, AWR die 120. AWR die 420*a* may include one or more resonators 425*a*, and AWR die 420*b* may include one or more resonators 425*b*. Resonators 425*a* and 425*b* may be similar to, and share one or more characteristics withy, resonators 125.

AWR die 420*b* may be coupled with lid 415 at least partially using seal 445*b*, which may be similar to, and share one or more characteristics with, seal 145. AWR die 420*a* may be coupled with AWR die 420*b*. A seal 445*a*, which may be similar to seal 145, may be positioned between and physically coupled with both AWR die 420*a* and AWR die 420*b*. In this way, the cavity between the AWR dies 420*a* and 420*b* may be hermetically sealed by seal 445*a*, and resonator 425*a* may be physically, atmospherically, electromagnetically, or hermetically sealed as described above. In this embodiment, it will be understood that AWR die 420*b* may include one or more conductive pathways such that AWR die 420*a* may be communicatively coupled with, for example, lid 415 or some other element of the RF FEM 400 through the AWR die 420*b*.

Figure 5:
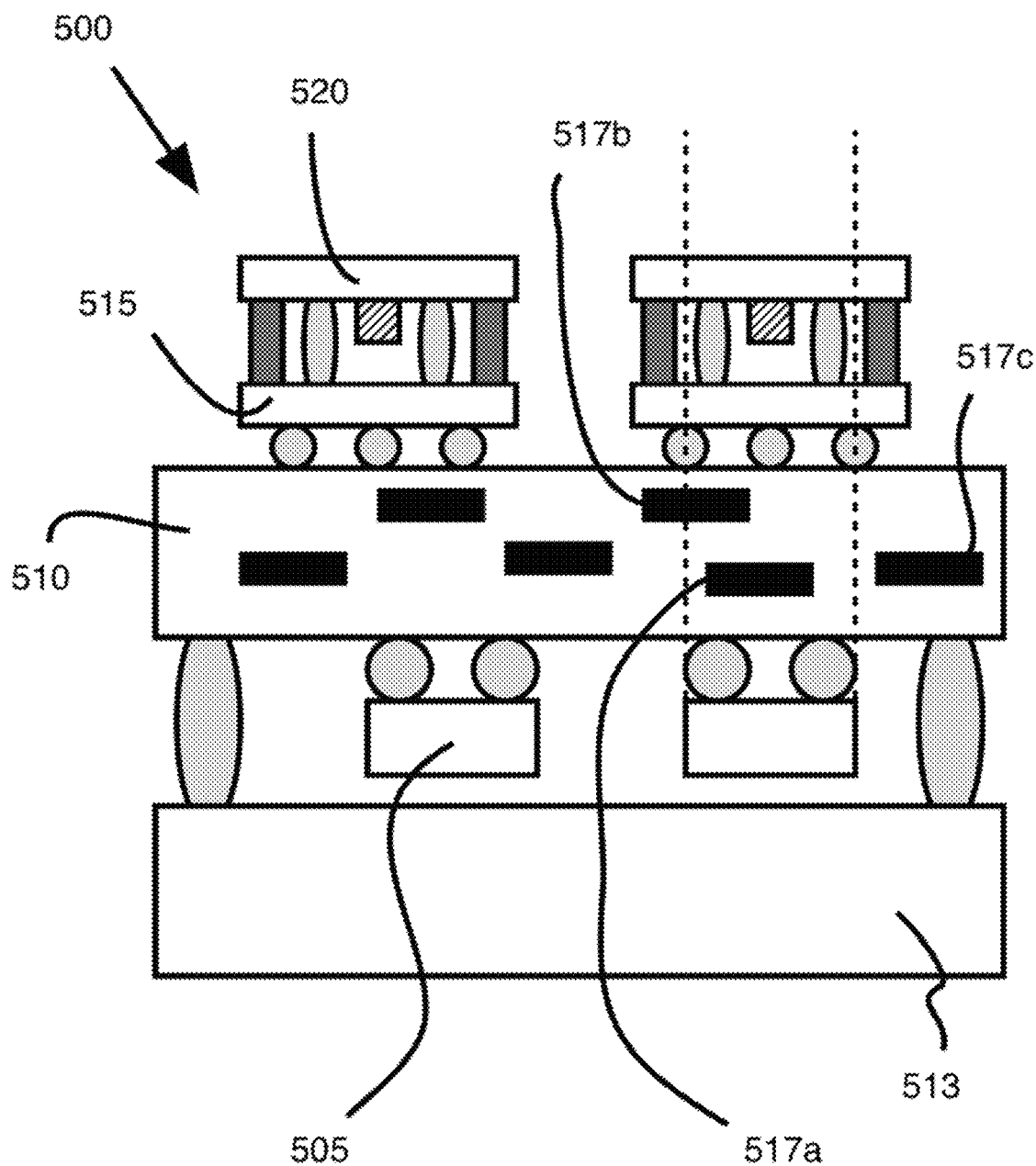
FIG. 5 depicts a side view of an alternative example of an integrated RF FEM, in accordance with various embodiments.

In some embodiments, it may be desirable to vertically integrate the various elements of the RF FEM in some other configuration than depicted in FIGS. 1-4. FIG. 5 depicts an example RF FEM 500 wherein the vertical integration may be achieved through the use of a double-sided substrate. In this embodiment, passive components such as conductors may be integrated into the double-sided substrate with the die shadow of an active die.

The RF FEM 500 may include a package substrate 510 which may be similar to, and share one or more characteristics with, package substrate 110. The RF FEM 500 may include a plurality of AWR dies 520 coupled with one side of the package substrate 510. The AWR dies 520 may be similar to, and share one or more characteristics with, AWR die 120. A lid 515 (which may be similar to, and share one or more characteristics with, lid 115) may be coupled with, and positioned between, the package substrate 510 and the AWR die 520. However, as discussed above, in some embodiments the AWR die 520 may be coupled directly with the package substrate 510 without the intervening lid 515.

One or more active dies 505 may be coupled with the package substrate 510 at a side of the package substrate 510 that is opposite the side to which the AWR dies 520 are coupled. The active dies 505 may be similar to, and share one or more characteristic with, active die 105. For example, the active dies 505 may be, or may include, a PA, a RFIC, a switch, etc.

The RF FEM 500 may be coupled with a further substrate 513. As described above, the substrate 513 may be a PCB, an interposer, a motherboard, an element of an electronic device to which the RF FEM 500 is coupled, etc. Generally, the substrate 513 may be similar to a package substrate such as package substrate 110. For example, the substrate 513 may be cored or coreless, organic or non-organic, etc. The substrate 513 may include a number of additional active or passive components positioned therein, or coupled thereto, that are not shown in FIG. 1. For example, the substrate 513 may include a number of active dies, passive components such as capacitors, resistors, inductors, etc., or some other component of an electronic device. Additionally, the substrate 513 may include one or more conductive elements such as traces, pads, vias, microstrips, striplines, etc. either positioned on the surface of the substrate 513 or within the substrate. The various conductive elements may be coupled with one another to form one or more conductive pathways as described above with respect to conductive pathways 165/170/175.

In embodiments, the package substrate 510 may include one or more passive components 517*a*, 517*b*, 517*c* (collectively referred to as passive components 517). The passive components 517 may include capacitors, resistors, inductors, etc. In some embodiments all of the passive components 517 may be inductors as described above which may be used for termination or matching of various other components or circuits. In some embodiments, one or more of the passive components may be positioned within the die shadow of one or more of the active dies 505. For example, the die shadow of an active die 505 may be characterized by the dashed vertical lines (as oriented with respect to FIG. 5). As can be seen, certain of the passive components 517, for example passive component 517*b*, may be only partially within the die shadow of an active die 505. Certain others of the passive components 517, for example passive component 517*a*, may be fully within the die shadow of an active die 505. Others of the passive components 517, for example passive component 517*c*, may be fully outside of the die shadow of an active die 505.

It will be understood that the above descriptions and depicted configuration of FIGS. 1-5 are intended as non-exclusive examples of the present disclosure. Other embodiments may have other configurations than depicted. For example, some embodiments may include more or fewer interconnects, pads, resonators, AWR dies, conductive pathways, active dies, etc. than are depicted in the various Figures. In some embodiments certain elements may be larger or smaller than depicted with respect to another in one or more directions. For example, in some embodiments various of the interconnects may be larger or smaller, thinner or wider, etc. than depicted. Generally, unless otherwise specifically stated, the relative sizes of elements may be different than depicted. Other variations may be present in other embodiments.

Figure 6:
FIG. 6 depicts an example technique for the manufacture of an integrated RF FEM, in accordance with various embodiments.

FIG. 6 depicts an example technique for the manufacture of an integrated RF FEM, in accordance with various embodiments. The technique may be described with respect to elements of FIG. 1, however it will be understood that the technique may be applicable, in whole or in part, with or without modification, to other embodiments of the present disclosure.

Generally, the technique may include positioning, at 605, an AWR die adjacent to a package substrate. The AWR die may be similar to, for example, AWR die 120. The package substrate may be similar to, for example package substrate 110.

The technique may further include coupling, at 610, an active die with the package substrate. The active die may be similar to, for example, active die 105. The active die may be coupled with the package substrate such that the AWR die is between the active die and the package substrate.

It will be understood that this technique is intended as one example of a technique which may be used to manufacture a RF FEM in accordance with embodiments herein. However, in other embodiments, the technique may include more or fewer elements than are described herein, or the elements of the technique may be performed in an order that is different than the order shown in FIG. 6. Other variations may be present in other embodiments.

Figure 7:
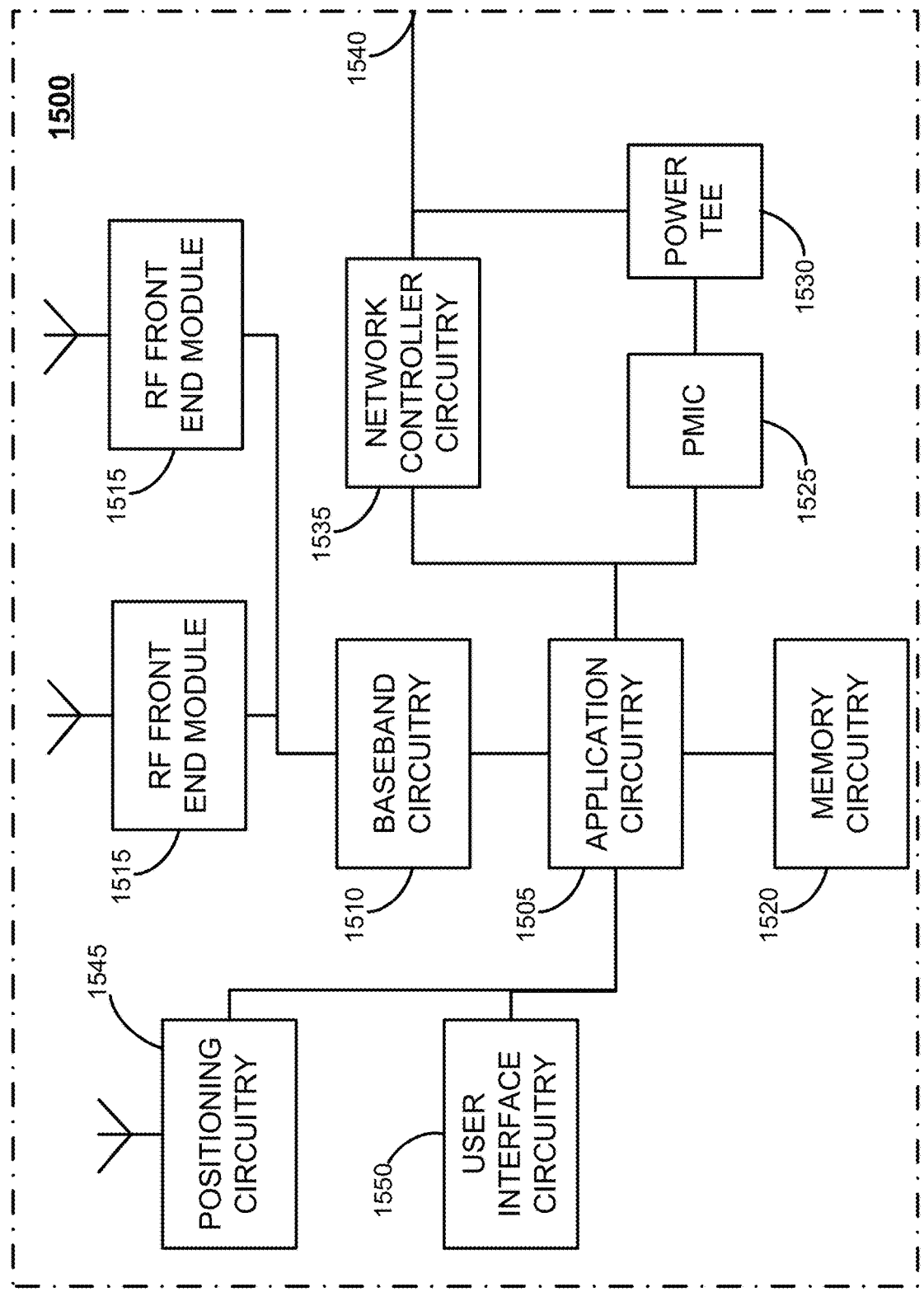
FIG. 7 illustrates an example of infrastructure equipment, in accordance with various embodiments.

FIG. 7 illustrates an example of infrastructure equipment 1500 in accordance with various embodiments. The infrastructure equipment 1500 (or "system 1500") may be implemented as a base station, radio head, radio access network (RAN) node, etc. In other examples, the system 1500 could be implemented in or by a user equipment (UE), application server(s), or some other element/device discussed herein. The system 1500 may include one or more of application circuitry 1505, baseband circuitry 1510, one or more RF FEMs 1515 (which may be similar to, and share one or more characteristics of, one or more of RF FEMs 100-500), memory 1520, PMIC 1525, power tee circuitry 1530, network controller 1535, network interface connector 1540, satellite positioning circuitry 1545, and user interface 1550. In some embodiments, the platform 1600 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

As used herein, the term "circuitry" may refer to, is part of, or includes hardware components such as an electronic circuit, a logic circuit, a processor (shared, dedicated, or group) and/or memory (shared, dedicated, or group), an ASIC, a field-programmable device (FPD) (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality. In addition, the term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The terms "application circuitry" and/or "baseband circuitry" may be considered synonymous to, and may be referred to as "processor circuitry." As used herein, the term "processor circuitry" may refer to, is part of, or includes circuitry capable of sequentially and automatically carrying out a sequence of arithmetic or logical operations; and recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes.

Furthermore, the various components of the core network may be referred to as "network elements." The term "network element" may describe a physical or virtualized equipment used to provide wired or wireless communication network services. The term "network element" may be considered synonymous to and/or referred to as a networked computer, networking hardware, network equipment, network node, router, switch, hub, bridge, radio network controller, RAN device, gateway, server, virtualized network function (VNF), network functions virtualization infrastructure (NFVI), and/or the like.

Application circuitry 1505 may include one or more CPU cores and one or more of cache memory, low drop-out voltage regulators (LDOs), interrupt controllers, serial interfaces such as serial peripheral interface (SPI), I2C or universal programmable serial interface module, real time clock (RTC), timer-counters including interval and watchdog timers, general purpose input/output (I/O or IO), memory card controllers such as secure digital (SD/)Multimedia Card (MMC) or similar, Universal Serial Bus (USB) interfaces, Mobile Industry Processor Interface (MIPI) interfaces and Joint Test Access Group (JTAG) test access ports. As examples, the application circuitry 1505 may include one or more Intel Pentium®, Core®, or Xeon® processor(s); Advanced Micro Devices (AMD) Ryzen® processor(s), Accelerated Processing Units (APUs), or Epyc® processors; and/or the like. In some embodiments, the system 1500 may not utilize application circuitry 1505, and instead may include a special-purpose processor/controller to process IP data received from an EPC or 5GC, for example.

Additionally or alternatively, application circuitry 1505 may include circuitry such as, but not limited to, one or more FPDs such as FPGAs and the like; PLDs such as complex PLDs (CPLDs), high-capacity PLDs (HCPLDs), and the like; ASICs such as structured ASICs and the like; programmable SoCs (PSoCs); and the like. In such embodiments, the circuitry of application circuitry 1505 may comprise logic blocks or logic fabric including other interconnected resources that may be programmed to perform various functions, such as the procedures, methods, functions, etc. of the various embodiments discussed herein. In such embodiments, the circuitry of application circuitry 1505 may include memory cells (e.g., erasable programmable read-only memory (EPROM), electrically erasable programmable read-only memory (EEPROM), flash memory, static memory (e.g., static random-access memory (SRAM), anti-fuses, etc.)) used to store logic blocks, logic fabric, data, etc. in lookup-tables (LUTs) and the like.

The baseband circuitry 1510 may be implemented, for example, as a solder down substrate including one or more integrated circuits, a single packaged integrated circuit soldered to a main circuit board or a multi-chip module containing two or more integrated circuits. Although not shown, baseband circuitry 1510 may comprise one or more digital baseband systems, which may be coupled via an interconnect subsystem to a CPU subsystem, an audio subsystem, and an interface subsystem. The digital baseband subsystems may also be coupled to a digital baseband interface and a mixed-signal baseband subsystem via another interconnect subsystem. Each of the interconnect subsystems may include a bus system, point-to-point connections, network-on-chip (NOC) structures, and/or some other suitable bus or interconnect technology, such as those discussed herein. The audio subsystem may include digital signal processing circuitry, buffer memory, program memory, speech processing accelerator circuitry, data converter circuitry such as analog-to-digital and digital-to-analog converter circuitry, analog circuitry including one or more of amplifiers and filters, and/or other like components. In an aspect of the present disclosure, baseband circuitry 1510 may include protocol processing circuitry with one or more instances of control circuitry (not shown) to provide control functions for the digital baseband circuitry and/or radio frequency circuitry (for example, the RF FEMs 1515).

User interface circuitry 1550 may include one or more user interfaces designed to enable user interaction with the system 1500 or peripheral component interfaces designed to enable peripheral component interaction with the system 1500. User interfaces may include, but are not limited to, one or more physical or virtual buttons (e.g., a reset button), one or more indicators (e.g., light-emitting diodes (LEDs)), a physical keyboard or keypad, a mouse, a touchpad, a touchscreen, speakers or other audio emitting devices, microphones, a printer, a scanner, a headset, a display screen or display device, etc. Peripheral component interfaces may include, but are not limited to, a non-volatile memory port, a USB port, an audio jack, a power supply interface, etc.

The RF FEMs 1515 may comprise a millimeter wave and one or more sub-millimeter wave RFICs. In some implementations, the one or more sub-millimeter wave RFICs may be physically separated from the millimeter wave circuitry. The RFICs may include connections to one or more antennas or antenna arrays, and the RF FEM may be connected to multiple antennas. In alternative implementations, both millimeter wave and sub-millimeter wave radio functions may be implemented in the same physical RF FEM 1515. The RF FEMs 1515 may incorporate both millimeter wave antennas and sub-millimeter wave antennas.

The memory circuitry 1520 may include one or more of volatile memory including dynamic random-access memory (DRAM) and/or synchronous dynamic random-access memory (SDRAM), and nonvolatile memory (NVM) including high-speed electrically erasable memory (commonly referred to as flash memory), phase change random-access memory (PRAM), magnetoresistive random-access memory (MRAM), etc., and may incorporate the three-dimensional (3D) cross-point (XPOINT) memories from Intel® and Micron®. Memory circuitry 1520 may be implemented as one or more of solder down packaged integrated circuits, socketed memory modules and plug-in memory cards.

The PMIC 1525 may include voltage regulators, surge protectors, power alarm detection circuitry, and one or more backup power sources such as a battery or capacitor. The power alarm detection circuitry may detect one or more of brown out (under-voltage) and surge (over-voltage) conditions. The power tee circuitry 1530 may provide for electrical power drawn from a network cable to provide both power supply and data connectivity to the infrastructure equipment 1500 using a single cable.

The network controller circuitry 1535 may provide connectivity to a network using a standard network interface protocol such as Ethernet, Ethernet over GRE Tunnels, Ethernet over Multiprotocol Label Switching (MPLS), or some other suitable protocol. Network connectivity may be provided to/from the infrastructure equipment 1500 via network interface connector 1540 using a physical connection, which may be electrical (commonly referred to as a "copper interconnect"), optical, or wireless. The network controller circuitry 1535 may include one or more dedicated processors and/or FPGAs to communicate using one or more of the aforementioned protocols. In some implementations, the network controller circuitry 1535 may include multiple controllers to provide connectivity to other networks using the same or different protocols.

The positioning circuitry 1545 may include circuitry to receive and decode signals transmitted by one or more navigation satellite constellations of a global navigation satellite system (GNSS). Examples of navigation satellite constellations (or GNSS) may include United States' Global Positioning System (GPS), Russia's Global Navigation System (GLONASS), the European Union's Galileo system, China's BeiDou Navigation Satellite System, a regional navigation system or GNSS augmentation system (e.g., Navigation with Indian Constellation (NAVIC), Japan's Quasi-Zenith Satellite System (QZSS), France's Doppler Orbitography and Radio-positioning Integrated by Satellite (DORIS), etc.), or the like. The positioning circuitry 1545 may comprise various hardware elements (e.g., including hardware devices such as switches, filters, amplifiers, antenna elements, and the like to facilitate the communications over-the-air (OTA) communications) to communicate with components of a positioning network, such as navigation satellite constellation nodes.

Nodes or satellites of the navigation satellite constellation(s) ("GNSS nodes") may provide positioning services by continuously transmitting or broadcasting GNSS signals along a line of sight, which may be used by GNSS receivers (e.g., positioning circuitry 1545 and/or positioning circuitry implemented by UEs or the like) to determine their GNSS position. The GNSS signals may include a pseudo-random code (e.g., a sequence of ones and zeros) that is known to the GNSS receiver and a message that includes a time of transmission (ToT) of a code epoch (e.g., a defined point in the pseudorandom code sequence) and the GNSS node position at the ToT. The GNSS receivers may monitor/measure the GNSS signals transmitted/broadcasted by a plurality of GNSS nodes (e.g., four or more satellites) and solve various equations to determine a corresponding GNSS position (e.g., a spatial coordinate). The GNSS receivers also implement clocks that are typically less stable and less precise than the atomic clocks of the GNSS nodes, and the GNSS receivers may use the measured GNSS signals to determine the GNSS receivers' deviation from true time (e.g., an offset of the GNSS receiver clock relative to the GNSS node time). In some embodiments, the positioning circuitry 1545 may include a Micro-Technology for Positioning, Navigation, and Timing (Micro-PNT) IC that uses a master timing clock to perform position tracking/estimation without GNSS assistance.

The GNSS receivers may measure the time of arrivals (ToAs) of the GNSS signals from the plurality of GNSS nodes according to its own clock. The GNSS receivers may determine time of flight (ToF) values for each received GNSS signal from the ToAs and the ToTs, and then may determine, from the ToFs, a three-dimensional (3D) position and clock deviation. The 3D position may then be converted into a latitude, longitude and altitude. The positioning circuitry 1545 may provide data to application circuitry 1505, which may include one or more of position data or time data. Application circuitry 1505 may use the time data to synchronize operations with other radio base stations (e.g., RAN nodes).

The components shown by FIG. 7 may communicate with one another using interface circuitry. As used herein, the term "interface circuitry" may refer to, is part of, or includes circuitry providing for the exchange of information between two or more components or devices. The term "interface circuitry" may refer to one or more hardware interfaces, for example, buses, input/output (I/O) interfaces, peripheral component interfaces, network interface cards, and/or the like. Any suitable bus technology may be used in various implementations, which may include any number of technologies, including industry standard architecture (ISA), extended ISA (EISA), peripheral component interconnect (PCI), peripheral component interconnect extended (PCIx), PCI express (PCIe), or any number of other technologies. The bus may be a proprietary bus, for example, used in a SoC based system. Other bus systems may be included, such as an I2C interface, an SPI interface, point-to-point interfaces, and a power bus, among others.

Figure 8:
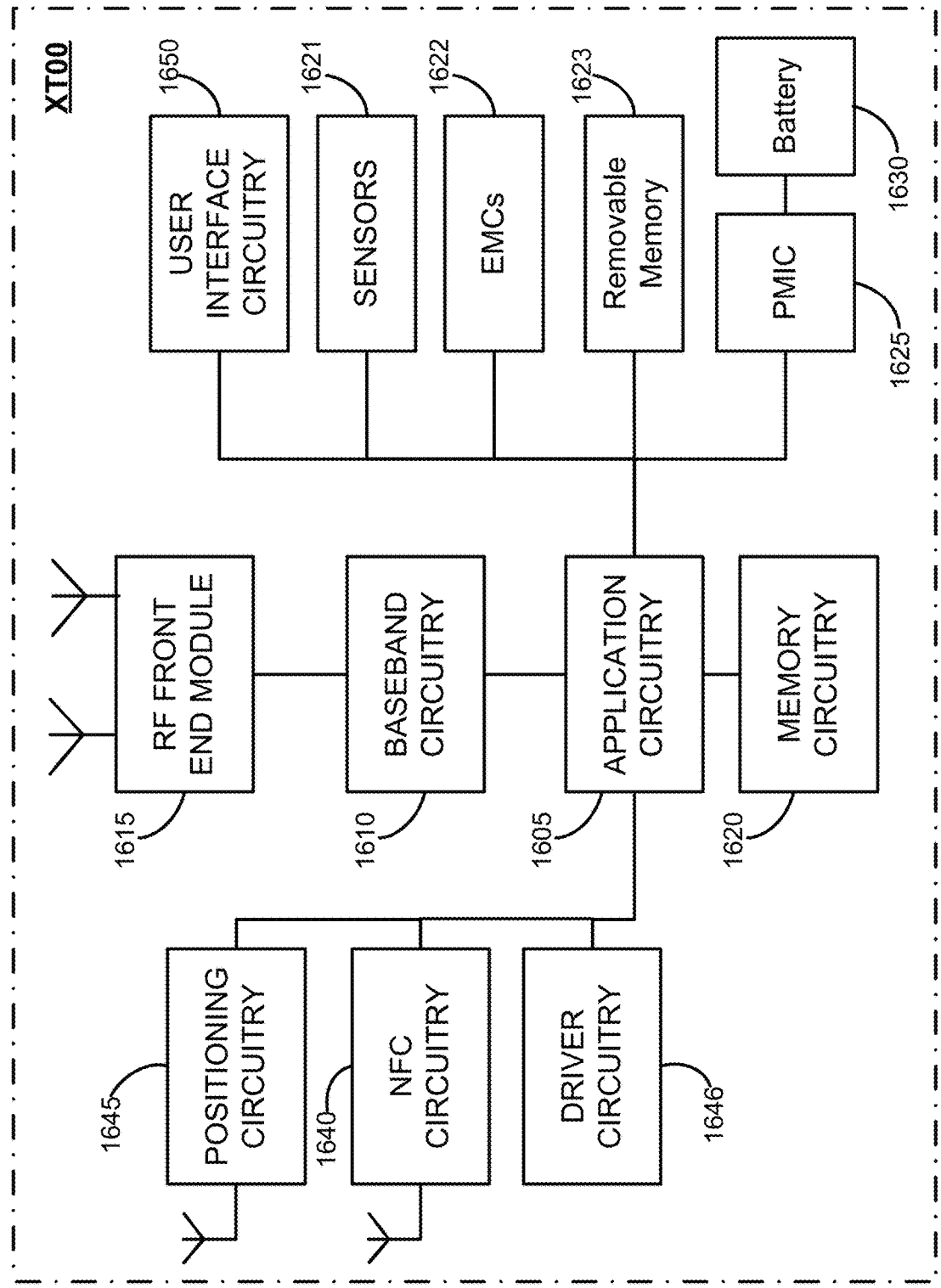
FIG. 8 illustrates an example of a computer platform, in accordance with various embodiments.
Figure 9:
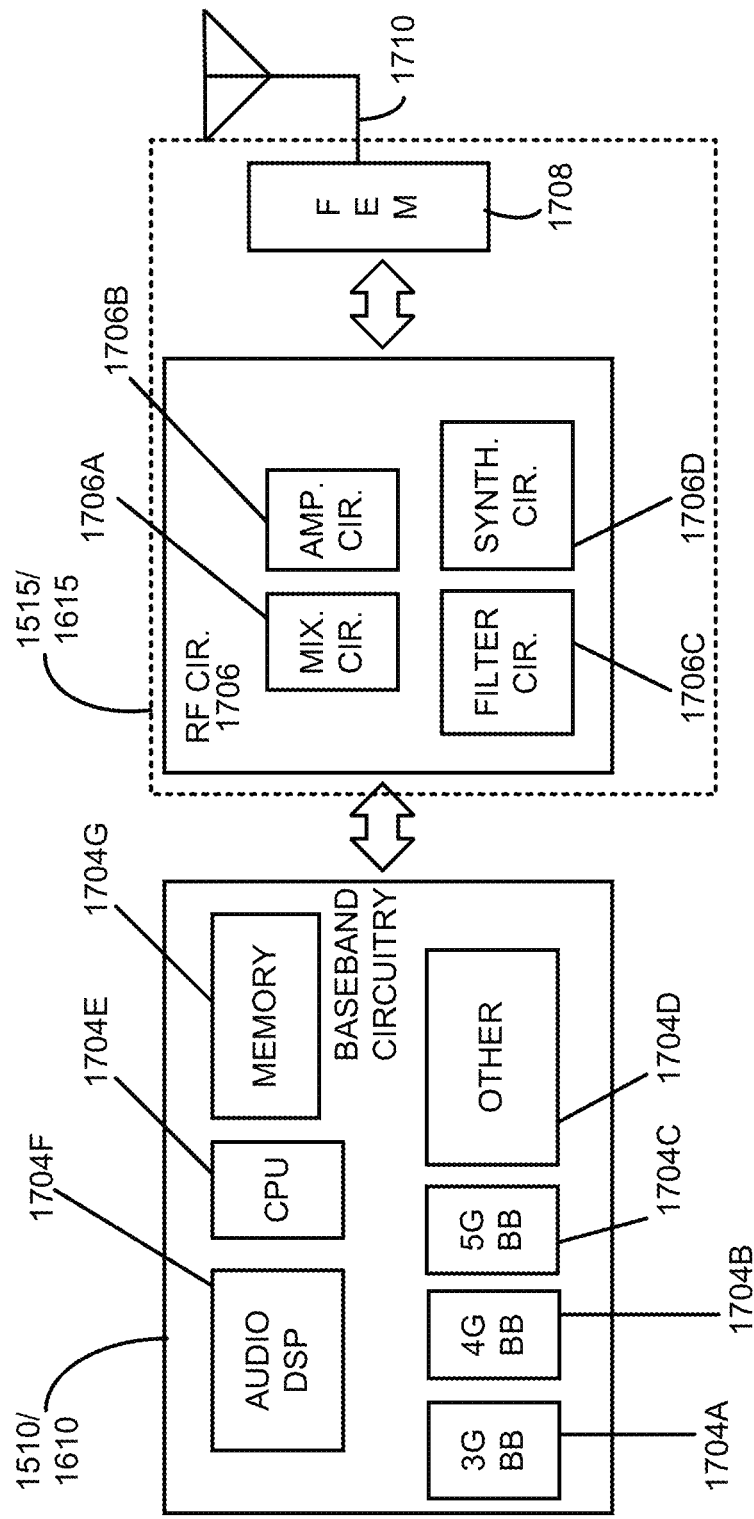
FIG. 9 illustrates example components of baseband circuitry and a RF FEM, in accordance with various embodiments.

FIG. 8 illustrates an example of a platform 1600 (or "device 1600") in accordance with various embodiments. In embodiments, the computer platform 1600 may be suitable for use as UEs, application servers, or some other element/device discussed herein. The platform 1600 may include any combinations of the components shown in the example. The components of platform 1600 may be implemented as ICs, portions thereof, discrete electronic devices, or other modules, logic, hardware, software, firmware, or a combination thereof adapted in the computer platform 1600, or as components otherwise incorporated within a chassis of a larger system. The block diagram of FIG. 9 may show a high-level view of components of the system 1500 or platform 1600. However, some of the components shown may be omitted, additional components may be present, and different arrangement of the components shown may occur in other implementations.

The application circuitry 1605 may include circuitry such as, but not limited to single-core or multi-core processors and one or more of cache memory, low drop-out voltage regulators (LDOs), interrupt controllers, serial interfaces such as SPI, inter-integrated circuit (I2C) or universal programmable serial interface circuit, RTC, timer-counters including interval and watchdog timers, general purpose IO, memory card controllers such as secure digital/multimedia card (SD/MMC) or similar, USB interfaces, MIPI interfaces and JTAG test access ports. The processor(s) may include any combination of general-purpose processors and/or dedicated processors (e.g., graphics processors, application processors, etc.). The processors (or cores) may be coupled with or may include memory/storage and may be configured to execute instructions stored in the memory/storage to enable various applications or operating systems to run on the platform 1600. In some embodiments, processors of application circuitry 1505/1605 may process IP data packets received from an EPC or 5GC.

Application circuitry 1605 may be or may include a microprocessor, a multi-core processor, a multithreaded processor, an ultra-low voltage processor, an embedded processor, or other known processing element. In one example, the application circuitry 1605 may include an Intel® Architecture Core™ based processor, such as a Quark™, an Atom™, an i3, an i5, an i7, or an MCU-class processor, or another such processor available from Intel® Corporation, Santa Clara, CA The processors of the application circuitry 1605 may also be one or more of AMD Ryzen® processor(s) or APUs; A5-A9 processor(s) from Apple® Inc., Snapdragon™ processor(s) from Qualcomm® Technologies, Inc., Texas Instruments, Inc.® Open Multimedia Applications Platform (OMAP)™ processor(s); a MIPS-based design from MIPS Technologies, Inc.; an ARM-based design licensed from ARM Holdings, Ltd.; or the like. In some implementations, the application circuitry 1605 may be a part of a SoC in which the application circuitry 1605 and other components are formed into a single integrated circuit, or a single package, such as the Edison™ or Galileo™ SoC boards from Intel® Corporation.

Additionally or alternatively, application circuitry 1605 may include circuitry such as, but not limited to, one or more FPDs such as FPGAs and the like; PLDs such as complex PLDs (CPLDs), high-capacity PLDs (HCPLDs), and the like; ASICs such as structured ASICs and the like; programmable SoCs (PSoCs); and the like. In such embodiments, the circuitry of application circuitry 1605 may comprise logic blocks or logic fabric including other interconnected resources that may be programmed to perform various functions, such as the procedures, methods, functions, etc. of the various embodiments discussed herein. In such embodiments, the circuitry of application circuitry 1605 may include memory cells (e.g., EPROM, EEPROM, flash memory, static memory (e.g., SRAM, anti-fuses, etc.)) used to store logic blocks, logic fabric, data, etc. in lookup-tables (LUTs) and the like.

The baseband circuitry 1610 may be implemented, for example, as a solder down substrate including one or more IC, a single packaged IC soldered to a main circuit board, or a multi-chip module containing two or more IC. Although not shown, baseband circuitry 1610 may comprise one or more digital baseband systems, which may be coupled via an interconnect subsystem to a CPU subsystem, an audio subsystem, and an interface subsystem. The digital baseband subsystems may also be coupled to a digital baseband interface and a mixed-signal baseband subsystem via another interconnect subsystem. Each of the interconnect subsystems may include a bus system, point-to-point connections, NOC structures, and/or some other suitable bus or interconnect technology, such as those discussed herein. The audio subsystem may include digital signal processing circuitry, buffer memory, program memory, speech processing accelerator circuitry, data converter circuitry such as analog-to-digital and digital-to-analog converter circuitry, analog circuitry including one or more of amplifiers and filters, and/or other like components. In an aspect of the present disclosure, baseband circuitry 1610 may include protocol processing circuitry with one or more instances of control circuitry (not shown) to provide control functions for the digital baseband circuitry and/or radio frequency circuitry (for example, the RF FEMs 1615—which may be similar to, and share one or more characteristics of, one or more of RF FEMs 100-500).

The RF FEMs 1615 may comprise millimeter wave and one or more sub-millimeter wave RFICs. In some implementations, the one or more sub-millimeter wave RFICs may be physically separated from the millimeter wave circuitry. The RFICs may include connections to one or more antennas or antenna arrays, and the RF FEM may be connected to multiple antennas. In alternative implementations, both millimeter wave and sub-millimeter wave radio functions may be implemented in the same physical RF FEM 1615. The RF FEMs 1615 may incorporate both millimeter wave antennas and sub-millimeter wave antennas.

The memory circuitry 1620 may include any number and type of memory devices used to provide for a given amount of system memory. As examples, the memory circuitry 1620 may include one or more of volatile memory including random-access memory (RAM), dynamic RAM (DRAM) and/or synchronous dynamic RAM (SDRAM), and nonvolatile memory (NVM) including high-speed electrically erasable memory (commonly referred to as flash memory), PRAM, MRAM, etc. The memory circuitry 1620 may be developed in accordance with a Joint Electron Devices Engineering Council (JEDEC) low power double data rate (LPDDR)-based design, such as LPDDR2, LPDDR3, LPDDR4, or the like. Memory circuitry 1620 may be implemented as one or more of solder down packaged IC, single die package (SDP), dual die package (DDP) or quad die package (Q17P), socketed memory modules, dual inline memory modules (DIMMs) including microDIMMs or MiniDIMMs, and/or soldered onto a motherboard via a BGA. In low power implementations, the memory circuitry 1620 may be on-die memory or registers associated with the application circuitry 1605. To provide for persistent storage of information such as data, applications, operating systems and so forth, memory circuitry 1620 may include one or more mass storage devices, which may include, inter alia, a solid state disk drive (SSDD), hard disk drive (HDD), a micro HDD, resistance change memories, phase change memories, holographic memories, or chemical memories, among others. For example, the computer platform 1600 may incorporate the three-dimensional (3D) cross-point (XPOINT) memories from Intel® and Micron®.

Removable memory circuitry 1623 may include devices, circuitry, enclosures/housings, ports or receptacles, etc. used to coupled portable data storage devices with the platform 1600. These portable data storage devices may be used for mass storage purposes, and may include, for example, flash memory cards (e.g., SD cards, microSD cards, xD picture cards, and the like), and USB flash drives, optical discs, external HDDs, and the like.

The platform 1600 may also include interface circuitry (not shown) that is used to connect external devices with the platform 1600. The external devices connected to the platform 1600 via the interface circuitry may include sensors 1621, such as accelerometers, level sensors, flow sensors, temperature sensors, pressure sensors, barometric pressure sensors, and the like. The interface circuitry may be used to connect the platform 1600 to electro-mechanical components (EMCs) 1622, which may allow platform 1600 to change its state, position, and/or orientation, or move or control a mechanism or system. The EMCs 1622 may include one or more power switches, relays including electro-mechanical relays (EMRs) and/or solid state relays (SSRs), actuators (e.g., valve actuators, etc.), an audible sound generator, a visual warning device, motors (e.g., DC motors, stepper motors, etc.), wheels, thrusters, propellers, claws, clamps, hooks, and/or other like electro-mechanical components. In embodiments, platform 1600 may be configured to operate one or more EMCs 1622 based on one or more captured events and/or instructions or control signals received from a service provider and/or various clients.

In some implementations, the interface circuitry may connect the platform 1600 with positioning circuitry 1645, which may be the same or similar as the positioning circuitry 1545 discussed with regard to FIG. 7.

In some implementations, the interface circuitry may connect the platform 1600 with near field communication (NFC) circuitry 1640, which may include an NFC controller coupled with an antenna element and a processing device. The NFC circuitry 1640 may be configured to read electronic tags and/or connect with another NFC-enabled device.

The driver circuitry 1646 may include software and hardware elements that operate to control particular devices that are embedded in the platform 1600, attached to the platform 1600, or otherwise communicatively coupled with the platform 1600. The driver circuitry 1646 may include individual drivers allowing other components of the platform 1600 to interact or control various input/output (I/O) devices that may be present within, or connected to, the platform 1600. For example, driver circuitry 1646 may include a display driver to control and allow access to a display device, a touchscreen driver to control and allow access to a touchscreen interface of the platform 1600, sensor drivers to obtain sensor readings of sensors 1621 and control and allow access to sensors 1621, EMC drivers to obtain actuator positions of the EMCs 1622 and/or control and allow access to the EMCs 1622, a camera driver to control and allow access to an embedded image capture device, audio drivers to control and allow access to one or more audio devices.

The PMIC 1625 (also referred to as "power-management circuitry 1625") may manage power provided to various components of the platform 1600. In particular, with respect to the baseband circuitry 1610, the PMIC 1625 may control power-source selection, voltage scaling, battery charging, or DC-to-DC conversion. The PMIC 1625 may often be included when the platform 1600 is capable of being powered by a battery 1630, for example, when the device is included in a UE.

In some embodiments, the PMIC 1625 may control, or otherwise be part of, various power saving mechanisms of the platform 1600. For example, if the platform 1600 is in an RRC_Connected state, where it is still connected to the RAN node as it expects to receive traffic shortly, then it may enter a state known as Discontinuous Reception Mode (DRX) after a period of inactivity. During this state, the platform 1600 may power down for brief intervals of time and thus save power. If there is no data traffic activity for an extended period of time, then the platform 1600 may transition off to an RRC_Idle state, where it disconnects from the network and does not perform operations such as channel quality feedback, handover, etc. The platform 1600 goes into a very low power state and it performs paging where again it periodically wakes up to listen to the network and then powers down again. The platform 1600 may not receive data in this state, in order to receive data, it must transition back to RRC_Connected state. An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

A battery 1630 may power the platform 1600, although in some examples the platform 1600 may be mounted deployed in a fixed location, and may have a power supply coupled to an electrical grid. The battery 1630 may be a lithium ion battery, a metal-air battery, such as a zinc-air battery, an aluminum-air battery, a lithium-air battery, and the like. In some implementations, such as in V2X applications, the battery 1630 may be a typical lead-acid automotive battery.

In some implementations, the battery 1630 may be a "smart battery," which includes or is coupled with a Battery Management System (BMS) or battery monitoring integrated circuitry. The BMS may be included in the platform 1600 to track the state of charge (SoCh) of the battery 1630. The BMS may be used to monitor other parameters of the battery 1630 to provide failure predictions, such as the state of health (SoH) and the state of function (SoF) of the battery 1630. The BMS may communicate the information of the battery 1630 to the application circuitry 1605 or other components of the platform 1600. The BMS may also include an analog-to-digital (ADC) convertor that allows the application circuitry 1605 to directly monitor the voltage of the battery 1630 or the current flow from the battery 1630. The battery parameters may be used to determine actions that the platform 1600 may perform, such as transmission frequency, network operation, sensing frequency, and the like.

A power block, or other power supply coupled to an electrical grid may be coupled with the BMS to charge the battery 1630. In some examples, the power block may be replaced with a wireless power receiver to obtain the power wirelessly, for example, through a loop antenna in the computer platform 1600. In these examples, a wireless battery charging circuit may be included in the BMS. The specific charging circuits chosen may depend on the size of the battery 1630, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

Although not shown, the components of platform 1600 may communicate with one another using a suitable bus technology, which may include any number of technologies, including ISA, extended ISA (EISA), PCI, PCI extended (PCIx), PCI express (PCIe), a Time-Trigger Protocol (TTP) system, or a FlexRay system, or any number of other technologies. The bus may be a proprietary bus, for example, used in a SoC based system. Other bus systems may be included, such as an I2C interface, an SPI interface, point-to-point interfaces, and a power bus, among others.

FIG. 13 illustrates example components of baseband circuitry 1510/1610 and RF FEMs 1515/1615 in accordance with some embodiments. As shown, the RF FEM 1515/1615 may include RF circuitry 1706, FEM circuitry 1708, one or more antennas 1710 coupled together at least as shown.

The baseband circuitry 1510/1610 may include circuitry such as, but not limited to, one or more single-core or multi-core processors. The baseband circuitry 1510/1610 may include one or more baseband processors or control logic to process baseband signals received from a receive signal path of the RF circuitry 1706 and to generate baseband signals for a transmit signal path of the RF circuitry 1706. Baseband processing circuitry 1510/1610 may interface with the application circuitry 1505/1605 for generation and processing of the baseband signals and for controlling operations of the RF circuitry 1706. For example, in some embodiments, the baseband circuitry 1510/1610 may include a third generation (3G) baseband processor 1704A, a fourth generation (4G) baseband processor 1704B, a fifth generation (5G) baseband processor 1704C, or other baseband processor(s) 1704D for other existing generations, generations in development or to be developed in the future (e.g., second generation (2G), sixth generation (6G), etc.). The baseband circuitry 1510/1610 (e.g., one or more of baseband processors 1704A-D) may handle various radio control functions that enable communication with one or more radio networks via the RF circuitry 1706. In other embodiments, some or all of the functionality of baseband processors 1704A-D may be included in modules stored in the memory 1704G and executed via a CPU 1704E. The radio control functions may include, but are not limited to, signal modulation/demodulation, encoding/decoding, radio frequency shifting, etc. In some embodiments, modulation/demodulation circuitry of the baseband circuitry 1510/1610 may include Fast-Fourier Transform (FFT), preceding, or constellation mapping/demapping functionality. In some embodiments, encoding/decoding circuitry of the baseband circuitry 1510/1610 may include convolution, tail-biting convolution, turbo, Viterbi, or Low-Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 1510/1610 may include one or more audio DSP 1704F. The audio DSP(s) 1704F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 1510/1610 and the application circuitry 1505/1605 may be implemented together such as, for example, on a SoC.

In some embodiments, the baseband circuitry 1510/1610 may provide for communication compatible with one or more radio technologies. For example, in some embodiments, the baseband circuitry 1510/1610 may support communication with an evolved universal terrestrial radio access network (EUTRAN) or other wireless metropolitan area networks (WMAN), a wireless local area network (WLAN), a wireless personal area network (WPAN). Embodiments in which the baseband circuitry 1510/1610 is configured to support radio communications of more than one wireless protocol may be referred to as multi-mode baseband circuitry.

RF circuitry 1706 may enable communication with wireless networks using modulated electromagnetic radiation through a non-solid medium. In various embodiments, the RF circuitry 1706 may include switches, filters, amplifiers, etc. to facilitate the communication with the wireless network. RF circuitry 1706 may include a receive signal path which may include circuitry to down-convert RF signals received from the FEM circuitry 1608 and provide baseband signals to the baseband circuitry 1510/1610. RF circuitry 1706 may also include a transmit signal path which may include circuitry to up-convert baseband signals provided by the baseband circuitry 1510/1610 and provide RF output signals to the FEM circuitry 1608 for transmission.

In some embodiments, the receive signal path of the RF circuitry 1706 may include mixer circuitry 1706a, amplifier circuitry 1706b and filter circuitry 1706c. In some embodiments, the transmit signal path of the RF circuitry 1706 may include filter circuitry 1706c and mixer circuitry 1706a. RF circuitry 1706 may also include synthesizer circuitry 1706d for synthesizing a frequency for use by the mixer circuitry 1706a of the receive signal path and the transmit signal path. In some embodiments, the mixer circuitry 1706a of the receive signal path may be configured to down-convert RF signals received from the FEM circuitry 1708 based on the synthesized frequency provided by synthesizer circuitry 1706d. The amplifier circuitry 1706b may be configured to amplify the down-converted signals and the filter circuitry 1706c may be a low-pass filter (LPF) or band-pass filter (BPF) configured to remove unwanted signals from the down-converted signals to generate output baseband signals. Output baseband signals may be provided to the baseband circuitry 1510/1610 for further processing. In some embodiments, the output baseband signals may be zero-frequency baseband signals, although this is not a requirement. In some embodiments, mixer circuitry 1706a of the receive signal path may comprise passive mixers, although the scope of the embodiments is not limited in this respect.

In some embodiments, the mixer circuitry 1706a of the transmit signal path may be configured to up-convert input baseband signals based on the synthesized frequency provided by the synthesizer circuitry 1706d to generate RF output signals for the FEM circuitry 1708. The baseband signals may be provided by the baseband circuitry 1510/1610 and may be filtered by filter circuitry 1706c.

In some embodiments, the mixer circuitry 1706a of the receive signal path and the mixer circuitry 1706a of the transmit signal path may include two or more mixers and may be arranged for quadrature downconversion and upconversion, respectively. In some embodiments, the mixer circuitry 1706a of the receive signal path and the mixer circuitry 1706a of the transmit signal path may include two or more mixers and may be arranged for image rejection (e.g., Hartley image rejection). In some embodiments, the mixer circuitry 1706a of the receive signal path and the mixer circuitry 1706a may be arranged for direct downconversion and direct upconversion, respectively. In some embodiments, the mixer circuitry 1706a of the receive signal path and the mixer circuitry 1706a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 1706 may include analog-to-digital converter (ADC) and digital-to-analog converter (DAC) circuitry and the baseband circuitry 1510/1610 may include a digital baseband interface to communicate with the RF circuitry 1706.

In some dual-mode embodiments, a separate radio IC circuitry may be provided for processing signals for each spectrum, although the scope of the embodiments is not limited in this respect.

In some embodiments, the synthesizer circuitry 1706d may be a fractional N synthesizer or a fractional N/N+1 synthesizer, although the scope of the embodiments is not limited in this respect as other types of frequency synthesizers may be suitable. For example, synthesizer circuitry 1706d may be a delta-sigma synthesizer, a frequency multiplier, or a synthesizer comprising a phase-locked loop with a frequency divider.

The synthesizer circuitry 1706d may be configured to synthesize an output frequency for use by the mixer circuitry 1706a of the RF circuitry 1706 based on a frequency input and a divider control input. In some embodiments, the synthesizer circuitry 1706d may be a fractional N/N+1 synthesizer.

In some embodiments, frequency input may be provided by a voltage-controlled oscillator (VCO), although that is not a requirement. Divider control input may be provided by either the baseband circuitry 1510/1610 or the applications processor 1505/1605 depending on the desired output frequency. In some embodiments, a divider control input (e.g., N) may be determined from a look-up table based on a channel indicated by the applications processor 1505/1605.

Synthesizer circuitry 1706d of the RF circuitry 1706 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 1706d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 1706 may include an IQ/polar converter.

FEM circuitry 1708 may include a receive signal path which may include circuitry configured to operate on RF signals received from one or more antennas 1710, amplify the received signals and provide the amplified versions of the received signals to the RF circuitry 1706 for further processing. FEM circuitry 1708 may also include a transmit signal path which may include circuitry configured to amplify signals for transmission provided by the RF circuitry 1706 for transmission by one or more of the one or more antennas 1710. In various embodiments, the amplification through the transmit or receive signal paths may be done solely in the RF circuitry 1706, solely in the FEM 1708, or in both the RF circuitry 1706 and the FEM 1708.

In some embodiments, the FEM circuitry 1708 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 1706). The transmit signal path of the FEM circuitry 1708 may include a PA to amplify input RF signals (e.g., provided by RF circuitry 1706), and one or more filters to generate RF signals for subsequent transmission (e.g., by one or more of the one or more antennas 1710).

Processors of the application circuitry 1505/1605 and processors of the baseband circuitry 1510/1610 may be used to execute elements of one or more instances of a protocol stack. For example, processors of the baseband circuitry 1510/1610, alone or in combination, may be used execute Layer 3, Layer 2, or Layer 1 functionality, while processors of the baseband circuitry 1510/1610 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 10:
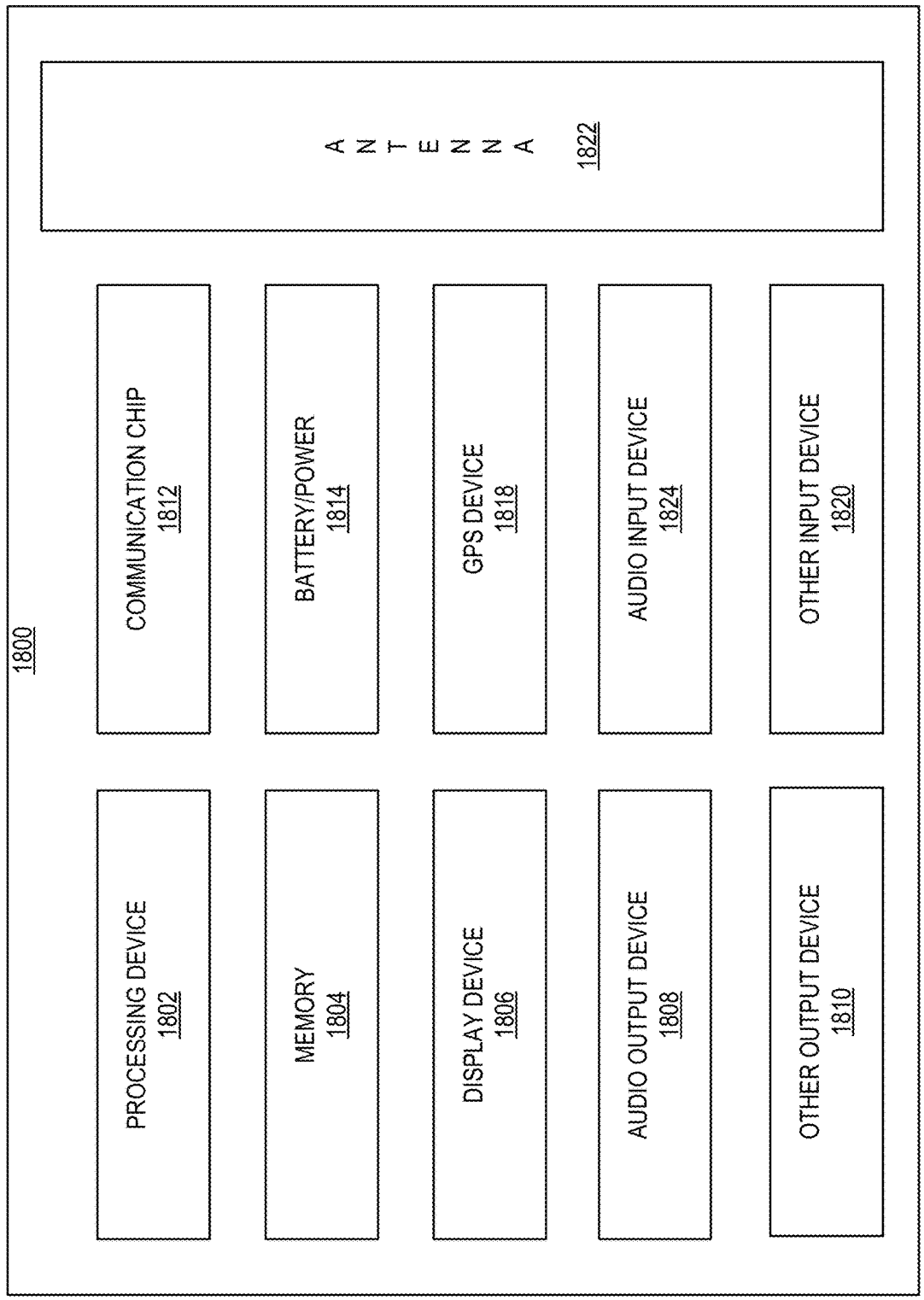
FIG. 10 is a block diagram of an example electrical device that may include a RF FEM with a filter stack, in accordance with various embodiments.

FIG. 10 is a block diagram of an example electrical device 1800 that may include a RF FEM with a filter stack, in accordance with any of the embodiments disclosed herein. For example, any suitable ones of the components of the electrical device 1800 may include one or more of the IC device assemblies 1700, IC packages 1650, platforms 1600, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single SoC die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more DSPs, ASICs, CPUs, graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded DRAM (eDRAM) or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE RAN (GERAN), Universal Terrestrial RAN (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as GPS, EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a RF FEM comprising: a package substrate; an AWR die; and an active die coupled with the package substrate such that the AWR die is between the active die and the package substrate.

Example 2 includes the RF FEM of example 1, wherein the AWR die is coupled with the package substrate.

Example 3 includes the RF FEM of example 2, wherein the AWR die is communicatively coupled with the active die through the package substrate.

Example 4 includes the RF FEM of example 2, further comprising a lid positioned between, and coupled to, the package substrate and the AWR die.

Example 5 includes the RF FEM of example 4, further comprising a seal positioned between, and coupled to, the lid and the AWR die, wherein the seal hermetically or electromagnetically seals a cavity between the AWR die and the lid.

Example 6 includes the RF FEM of example 4, wherein the lid includes silicon, silicon nitride, or ceramic.

Example 7 includes the RF FEM of any of examples 1-6, wherein the AWR die is physically and communicatively coupled with the active die.

Example 8 includes the RF FEM of any of examples 1-6, wherein the AWR die includes a plurality of resonators.

Example 9 includes the RF FEM of any of examples 1-6, wherein a resonator of the plurality of resonators is a contour mode resonator (CMR), a SAW resonator, a thin-FBAR, or a BAR.

Example 10 includes the RF FEM of any of examples 1-6, wherein a first resonator of the plurality of resonators is related to a first frequency band, and a second resonator of the plurality of resonators is related to a second frequency band that is different than the first frequency band.

Example 11 includes the RF FEM of any of examples 1-6, wherein the AWR die is a first AWR die, and wherein the RF FEM includes a second AWR die between the active die and the package substrate.

Example 12 includes the RF FEM of example 11, wherein the first AWR die is related to a first frequency band and the second AWR die is related to a second frequency band that is different than the first frequency band.

Example 13 includes the RF FEM of any of examples 1-6, wherein the active die includes circuitry related to RF control logic, a switch, a PMIC, a power amplifier, a mixer, or a phase shifter.

Example 14 includes the RF FEM of any of examples 1-6, wherein the RF FEM has a z-height, as measured in a direction perpendicular to a face of the package substrate to which the active die is coupled, of less than 800 micrometers.

Example 15 includes a method of manufacturing a RF FEM, wherein the method comprises: positioning a first AWR die adjacent to a package substrate; and coupling an active die with the package substrate such that the first AWR die is between the active die and the package substrate.

Example 16 includes the method of example 15, wherein positioning the first AWR die adjacent to the package substrate includes coupling the first AWR die to the package substrate.

Example 17 includes the method of example 15, further comprising coupling the active die with the first AWR die.

Example 18 includes the method of any of examples 15-17, wherein coupling the active die with the first AWR die occurs prior to positioning the first AWR die adjacent to the package substrate.

Example 19 includes the method of any of examples 15-17, further comprising positioning a second AWR die adjacent to the first AWR die, and wherein coupling the active die with the package substrate includes coupling the active die with the package substrate such that the second AWR die is between the active die and the package substrate.

Example 20 includes the method of any of examples 15-17, further comprising coupling, prior to the positioning of the first AWR die, the first AWR die to a lid, and wherein positioning the first AWR die includes positioning the first AWR die such that the lid is between the package substrate and the first AWR die.

Example 21 includes the method of example 20, wherein coupling the first AWR die to the lid includes wafer-to-wafer bonding.

Example 22 includes the method of example 20, wherein coupling the first AWR die to the lid includes physically coupling the first AWR die to the lid by a seal that hermetically or electromagnetically seals a cavity between the first AWR die and the lid.

Example 23 includes a RF FEM comprising: a package substrate that includes a first side and a second side opposite the first side; a resonator die coupled with the first side of the package substrate; and an active die coupled with the second side of the package substrate, wherein the resonator die is within a die shadow of the active die.

Example 24 includes the RF FEM of example 23, further comprising an inductor communicatively coupled with the resonator die, wherein the inductor is positioned within the package substrate within a die shadow of the active die.

Example 25 includes the RF FEM of example 23, wherein the die shadow of the active die is an area perpendicular to the second side of the package substrate.

Example 26 includes the RF FEM of any of examples 23-25, wherein the resonator die includes a contour mode resonator (CMR), a SAW resonator, a thin-FBAR, or a BAR.

Example 27 includes the RF FEM of any of examples 23-25, wherein the active die includes circuitry related to RF control logic, a switch, a PMIC, a power amplifier, a mixer, or a phase shifter.

Example 28 includes the RF FEM of any of examples 23-25, wherein the active die is a first active die, and wherein the RF FEM further includes a second active die coupled with the second side of the package substrate.

Example 29 includes the RF FEM of any of examples 23-25, wherein the resonator die is a first resonator die, and wherein the RF FEM further includes a second resonator die coupled with the first side of the package substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A radio frequency (RF) front-end module (FEM), comprising:
a package substrate;
a lid;
an acoustic wave resonator (AWR) die; and
an active die coupled with the package substrate, wherein the AWR die is between the active die and the lid, the lid is between the AWR die and the package substrate, the lid is separated from the package substrate by a first space, the AWR die is separated from the lid by a second space, and the active die is separated from the AWR die by a third space.

2. The RF FEM of claim 1, wherein the AWR die includes a plurality of resonators.

3. The RF FEM of claim 1, wherein the AWR die is a first AWR die, and wherein the RF FEM includes a second AWR die between the active die and the package substrate.

4. The RF FEM of claim 3, wherein the first AWR die is related to a first frequency band and the second AWR die is related to a second frequency band that is different than the first frequency band.

5. The RF FEM of claim 1, wherein the active die includes circuitry related to one or more of RF control logic, a switch, a power-management integrated circuit (PMIC), a power amplifier, a mixer, or a phase shifter.

6. The RF FEM of claim 1, wherein the RF FEM has a z-height, as measured in a direction perpendicular to a face of the package substrate to which the active die is coupled, of less than 800 micrometers.

7. The RF FEM of claim 1, further comprising an insulator separating the active die and the AWR die.

8. The RF FEM of claim 7, further comprising electrical interconnects extending through the insulator and connected to the active die and the AWR die.

9. The RF FEM of claim 1, wherein:
the active die has a first face and a second face opposite the first face,
the first face of the active die is closer to the AWR die than the second face of the active die,
and the first face of the active die is physically separated from the AWR die.

10. The RF FEM of claim 1, wherein:
the AWR die includes at least one resonator,
the AWR die has a first face and a second face opposite the first face,
the second face of the AWR die is closer to the active die than the first face of the AWR die and is physically separated from the active die by an insulator,
and at least one resonator is:
either at the first face of the AWR die,
or at the second face of the AWR die and separated from the active die by the insulator.

11. The RF FEM of claim 1, further comprising:
first interconnects in the first space, wherein the first interconnects are coupled with the lid and the package substrate; and
second interconnects in the second space, wherein the second interconnects are coupled with the lid and the AWR die.

12. The RF FEM of claim 11, further comprising:
third interconnects in a space between the lid and the active die, wherein the third interconnects are coupled with the lid and the active die.

13. The RF FEM of claim 12, further comprising:
fourth interconnects in a space between the package substrate and the active die, wherein the fourth interconnects are coupled with the package substrate and the active die.

14. The RF FEM of claim 1, wherein the AWR die is coupled with the package substrate.

15. The RF FEM of claim 1, wherein the AWR die is physically and communicatively coupled with the active die.

16. An integrated circuit (IC) package, comprising:
a first die comprising one or more resonators;
a second die comprising circuitry related to RF control logic, a switch, a power-management integrated circuit (PMIC), a power amplifier, a mixer, or a phase shifter;
a seal between the first die and the second die, wherein the one or more resonators are in a cavity between the first die and the second die and are physically separated from the second die, and wherein the cavity is a hermetically sealed cavity; and
a further component, wherein the second die is coupled with the further component, and wherein the first die is between the second die and the further component.

17. The IC package of claim 16, further comprising an interposer between the first die and the further component, wherein the one or more resonators are in a hermetically sealed cavity between the first die and the interposer.

18. The IC package of claim 17, further comprising:
first interconnects to electrically couple the first die and the interposer; and
second interconnects to electrically couple the interposer and the further component.

19. The IC package of claim 16, further comprising:
first interconnects to electrically couple the first die and the second die; and
second interconnects to electrically couple the second die and the further component.

20. The IC package of claim 16, wherein the one or more resonators include one or more acoustic wave resonators.

21. The IC package of claim 16, wherein the further component is one of a package substrate, a printed circuit board, an interposer, or a motherboard.

22. The IC package of claim 16, wherein the first die is physically separated from all surfaces of the second die.

* * * * *